(12) United States Patent
Okabe et al.

(10) Patent No.: US 11,793,041 B2
(45) Date of Patent: Oct. 17, 2023

(54) DISPLAY DEVICE HAVING A SLIT PASSING THROUGH THE SECOND FLATTENING FILM

(71) Applicant: SHARP KABUSHIKI KAISHA, Sakai (JP)

(72) Inventors: Tohru Okabe, Sakai (JP); Ryosuke Gunji, Sakai (JP); Kohji Ariga, Aioi (JP); Hiroki Taniyama, Sakai (JP); Shinji Ichikawa, Sakai (JP); Shinsuke Saida, Sakai (JP); Hiroharu Jinmura, Yonago (JP); Akira Inoue, Yonago (JP); Yoshihiro Kohara, Yonago (JP); Koji Tanimura, Yonago (JP); Yoshihiro Nakada, Yonago (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 546 days.

(21) Appl. No.: 17/057,567

(22) PCT Filed: May 22, 2018

(86) PCT No.: PCT/JP2018/019682
§ 371 (c)(1),
(2) Date: Nov. 20, 2020

(87) PCT Pub. No.: WO2019/224917
PCT Pub. Date: Nov. 28, 2019

(65) Prior Publication Data
US 2021/0210583 A1 Jul. 8, 2021

(51) Int. Cl.
*H10K 59/121* (2023.01)
*H10K 59/131* (2023.01)
*H10K 50/84* (2023.01)
*H10K 50/844* (2023.01)

(52) U.S. Cl.
CPC ......... *H10K 59/131* (2023.02); *H10K 50/841* (2023.02); *H10K 50/844* (2023.02); *H10K 59/1213* (2023.02)

(58) Field of Classification Search
CPC ............. H10K 59/1213; H10K 59/131; H10K 50/841; H10K 50/844
USPC ...................................................... 257/59, 72
See application file for complete search history.

(56) References Cited

U.S. PATENT DOCUMENTS

2013/0015450 A1* 1/2013 Kim ...................... H10K 59/38
257/40

FOREIGN PATENT DOCUMENTS

JP 2011-34996 A 2/2011

* cited by examiner

*Primary Examiner* — Hoai V Pham
(74) *Attorney, Agent, or Firm* — ScienBiziP, P.C.

(57) ABSTRACT

In a TFT layer provided on a base substrate, a first metal film, a first inorganic insulating film, a second metal film, a second inorganic insulating film, a third metal film, a first flattening film, a fourth metal film, and a second flattening film are sequentially layered. In a frame region, a slit is formed in the second flattening film to surround a display region, a first conductive layer formed by the fourth metal film is provided on the first flattening film exposed from the slit, and a TFT of a drive circuit is provided on the base substrate side of the first conductive layer to overlap with the first conductive layer.

19 Claims, 10 Drawing Sheets

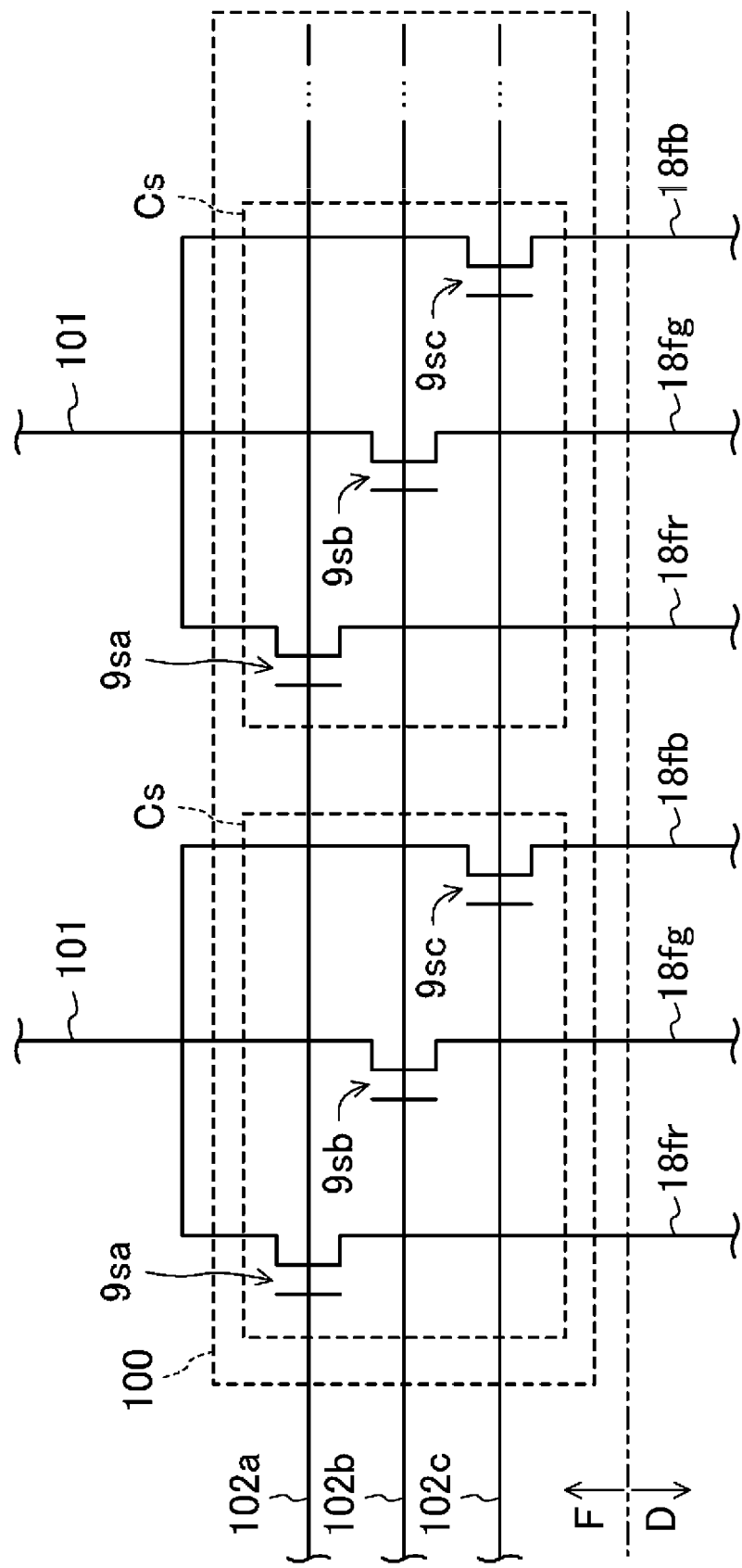

DISPLAY DEVICE HAVING A SLIT PASSING THROUGH THE SECOND FLATTENING FILM

TECHNICAL FIELD

The disclosure relates to a display device.

BACKGROUND ART

In recent years, organic EL display devices, which use organic electroluminescence (EL) elements and are of the self-luminous type, have attracted attention as a display device that can replace the liquid crystal display device. In the organic EL display device, there are provided a display region for displaying an image and a frame region surrounding the display region, where a frame narrowing technique to reduce the size of the frame region is required.

For example, PTL 1 discloses a transmissive organic EL display device including a lead-out wiring line made of a transparent conductive material that is extended from a display region to a frame region and electrically connects a display electrode in the display region and a drive integrated circuit (IC).

CITATION LIST

Patent Literature

PTL 1: JP 2011-34996 A

SUMMARY

Technical Problem

In a case where a lead-out wiring line of a frame region and a display wiring line (for example, a source line) disposed in a display region are formed by the same material and in the same layer, a thin film transistor (TFT) to constitute a drive circuit may not be provided in the region where the lead-out wiring line is disposed, so that, in the frame region, the lead-out wiring line and the TFT are disposed to be separated from each other in a plan view. This makes it difficult to achieve frame narrowing because the frame region is formed wide.

The disclosure has been conceived in view of the above problem, and an object thereof is to achieve frame narrowing in a display device in which a drive circuit is provided in a frame region in a monolithic manner.

Solution to Problem

To accomplish the object described above, a display device according to the disclosure is a display device that includes: a base substrate; a TFT layer which is provided on the base substrate and in which a first metal film, a first inorganic insulating film, a second metal film, a second inorganic insulating film, a third metal film, a first flattening film, a fourth metal film, and a second flattening film are sequentially layered; a light-emitting element included in a display region and provided on the TFT layer; and a frame region provided on a periphery of the display region; the light-emitting element including a plurality of first electrodes provided on the second flattening film, a plurality of light-emitting element layers provided on the plurality of first electrodes respectively, and a second electrode provided to be shared on the plurality of light-emitting element layers.

In the stated display device, in the frame region, a slit passing through the second flattening film is formed in the second flattening film to surround the display region; a first conductive layer formed by the fourth metal film is provided on the first flattening film exposed from the slit; and a TFT included in a drive circuit is provided on the base substrate side of the first conductive layer to overlap with the first conductive layer.

Advantageous Effects of Disclosure

According to the disclosure, in the frame region, a slit is formed in the second flattening film to surround the display region, the first conductive layer formed by the fourth metal film is provided on the first flattening film exposed from the slit, and a TFT included in the drive circuit is provided on the base substrate side of the first conductive layer, thereby making it possible to achieve the frame narrowing in the display device in which the drive circuit is provided in the frame region in a monolithic manner.

BRIEF DESCRIPTION OF DRAWINGS

FIG. 10 is an equivalent circuit diagram of a demultiplexer provided in a frame region of the organic EL display device according to the second embodiment of the disclosure.

DESCRIPTION OF EMBODIMENTS

Embodiments of the disclosure will be described below in detail with reference to the drawings. The disclosure is not limited to the embodiments described below.

First Embodiment

Figure 1:
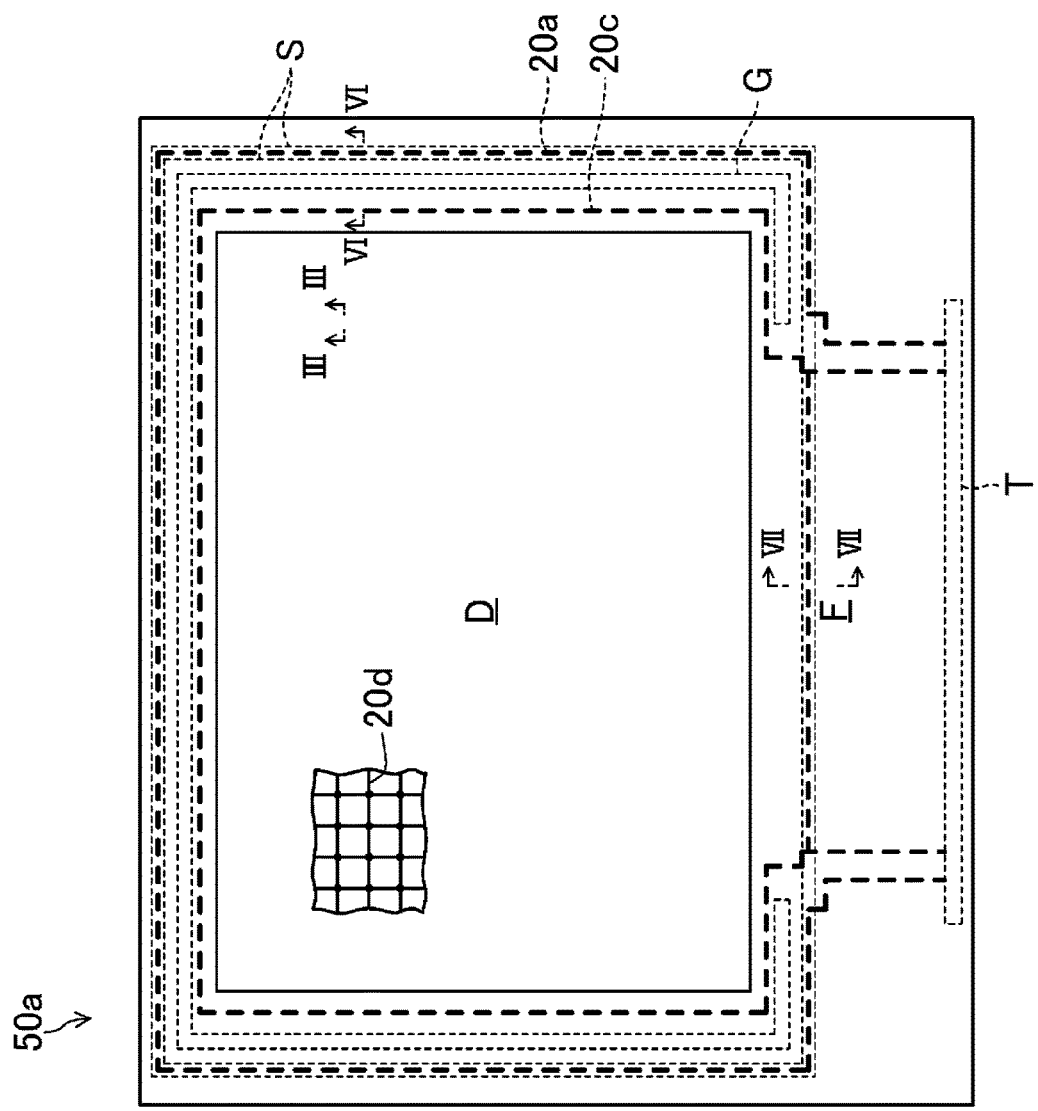
FIG. 1 is a plan view illustrating an overall configuration of an organic EL display device according to a first embodiment of the disclosure.
Figure 2:
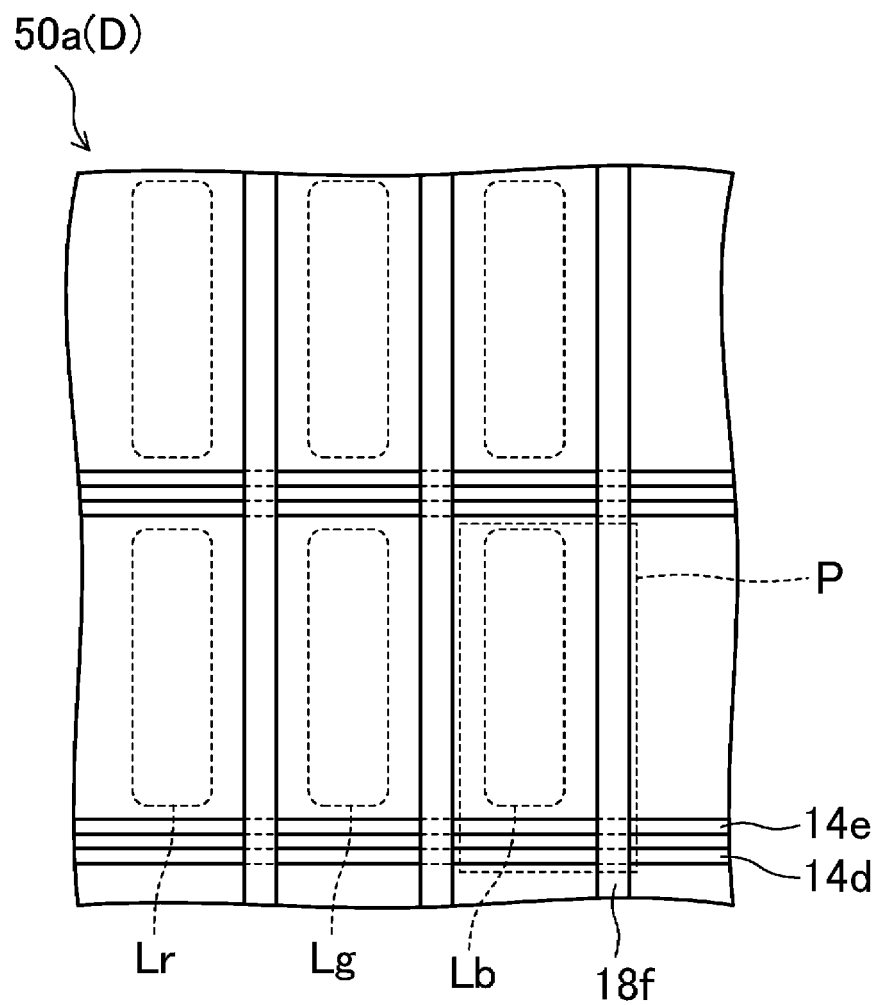
FIG. 2 is a plan view of a display region of the organic EL display device according to the first embodiment of the disclosure.
Figure 3:
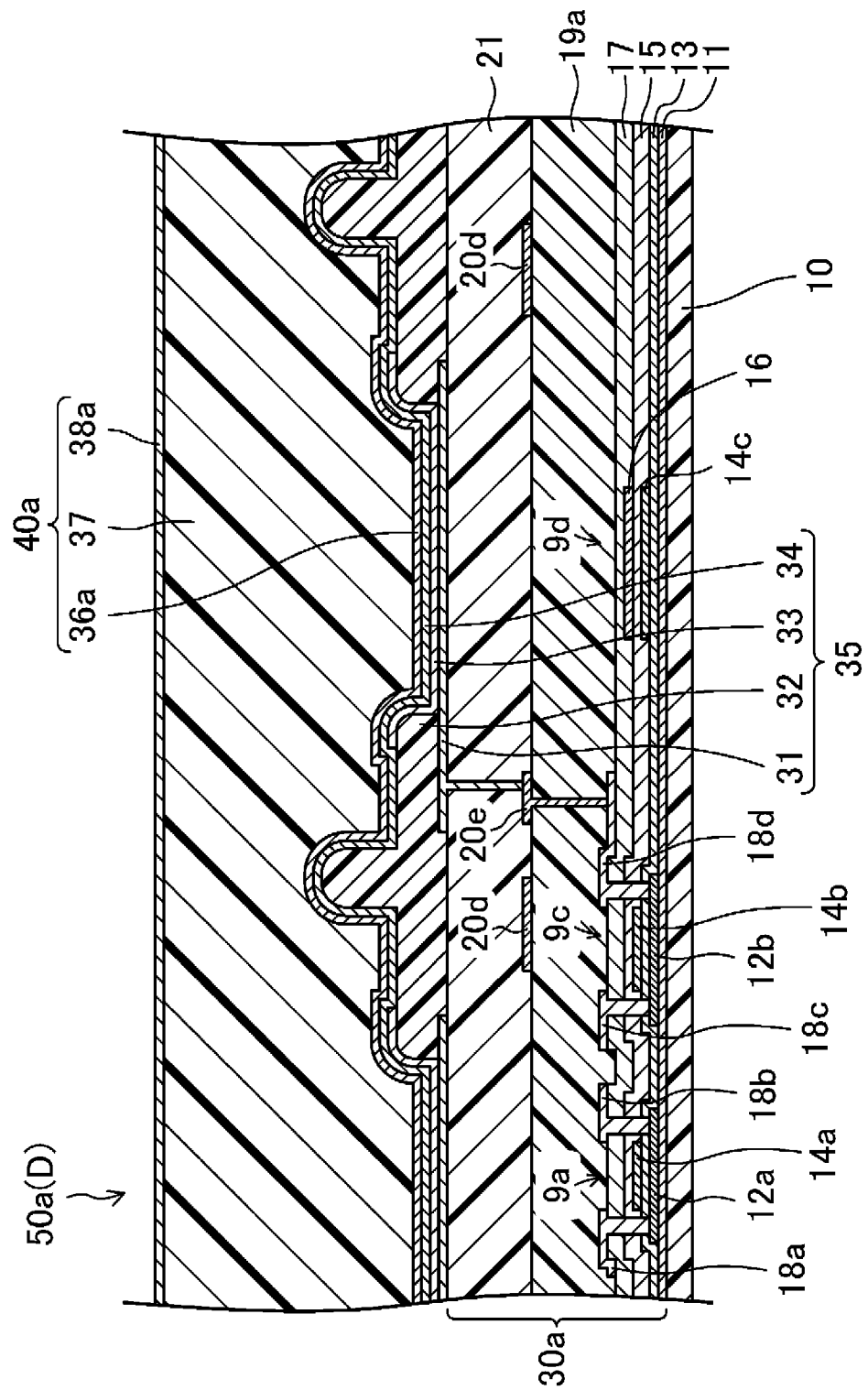
FIG. 3 is a cross-sectional view of a display region of the organic EL display device taken along a line III-III in FIG. 1.
Figure 4:
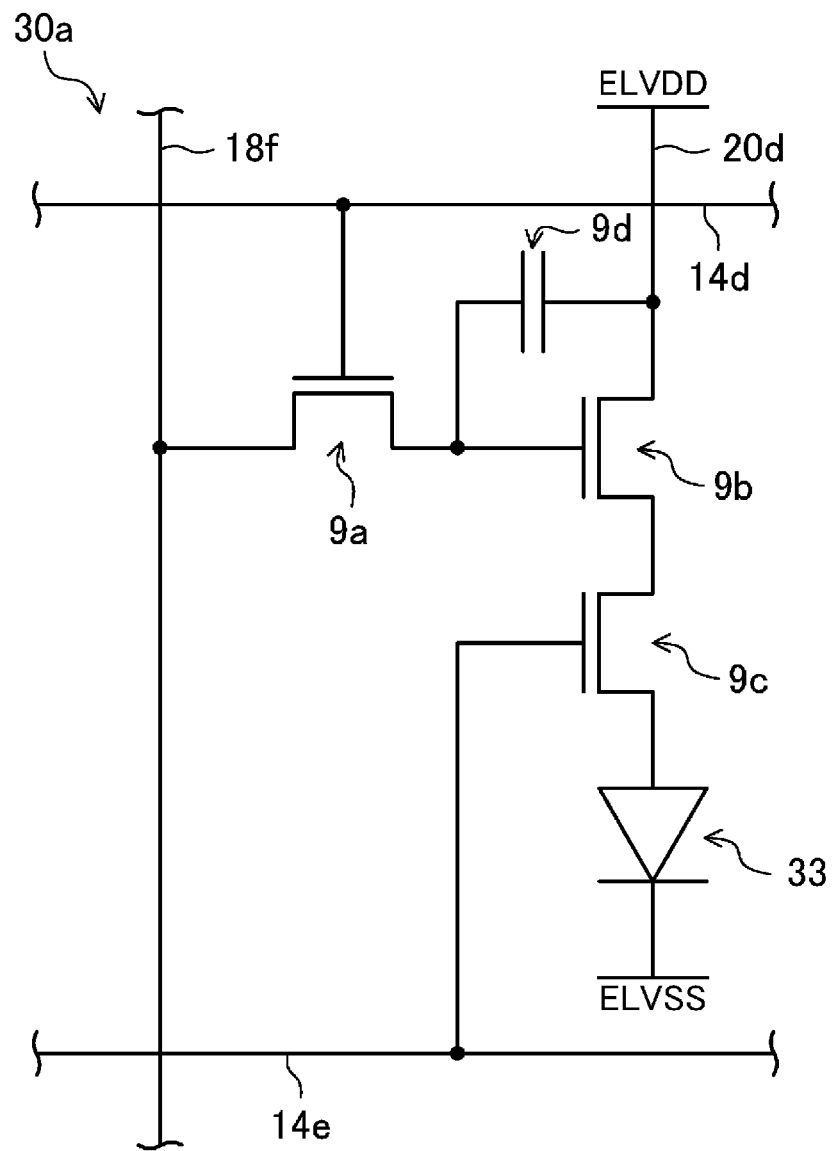
FIG. 4 is an equivalent circuit diagram of a TFT layer included in the organic EL display device according to the first embodiment of the disclosure.
Figure 5:
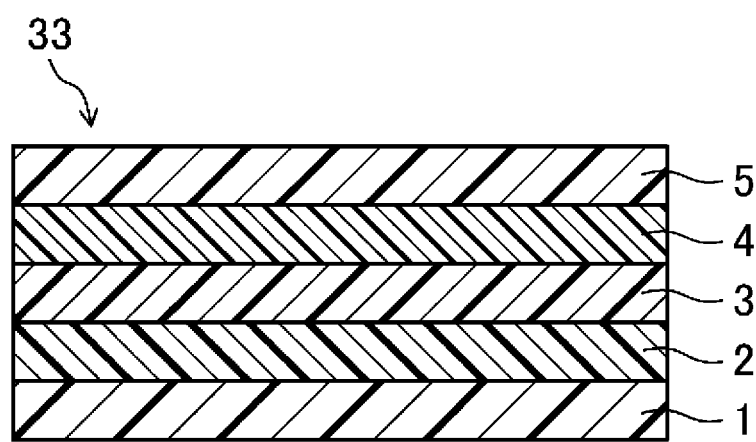
FIG. 5 is a cross-sectional view illustrating an organic EL layer included in the organic EL display device according to the first embodiment of the disclosure.
Figure 6:
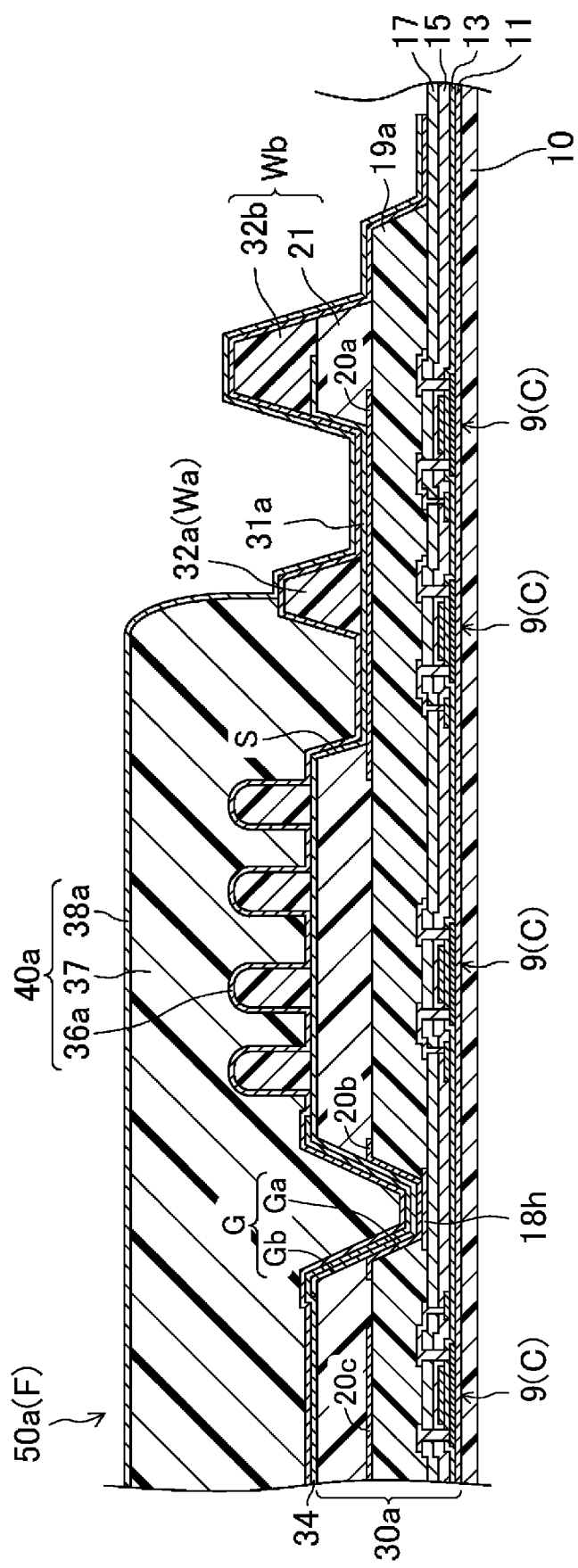
FIG. 6 is a cross-sectional view of a frame region of the organic EL display device taken along a line VI-VI in FIG. 1.
Figure 7:
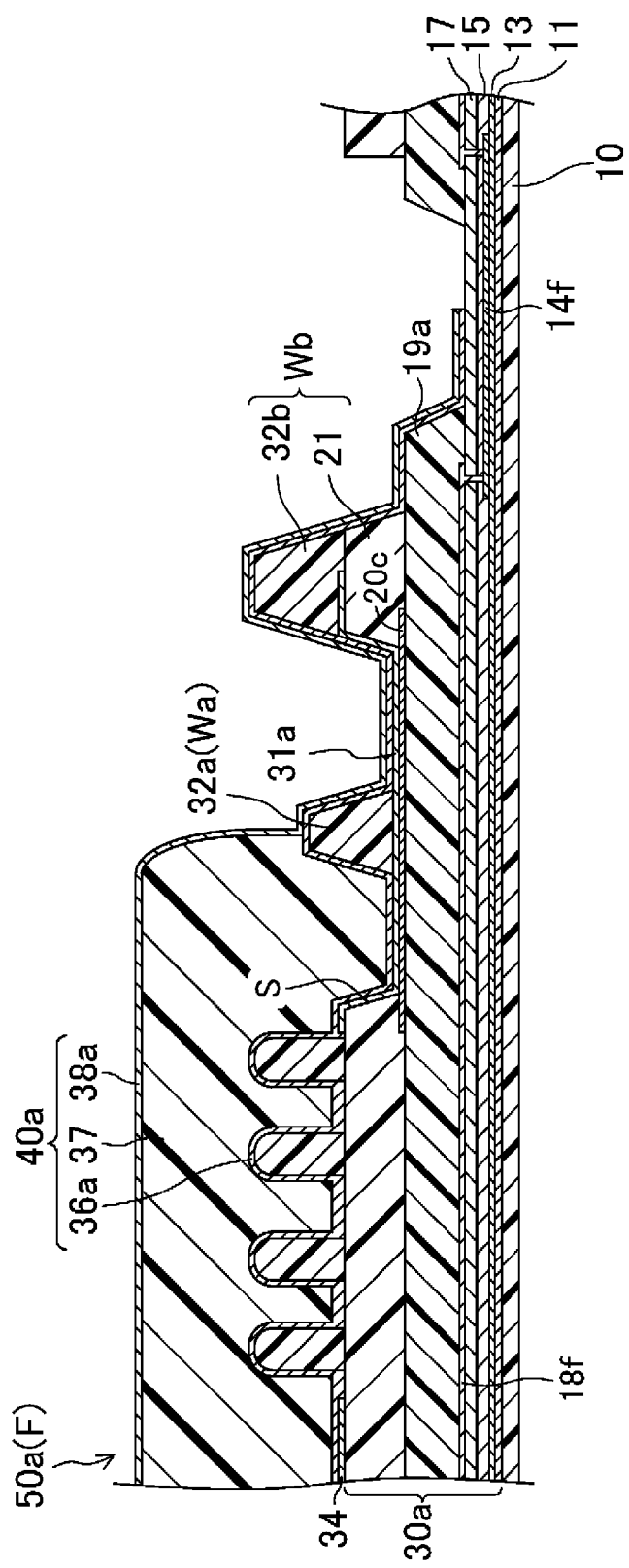
FIG. 7 is a cross-sectional view of a frame region of the organic EL display device taken along a line VII-VII in FIG. 1.

FIGS. 1 to 8 illustrate a first embodiment of a display device according to the disclosure. Note that, in each of the following embodiments, an organic EL display device including an organic EL element will be exemplified as a display device including a light-emitting element. Here, FIG. 1 is a plan view illustrating an overall configuration of an organic EL display device 50a according to the present embodiment. FIG. 2 is a plan view of a display region D of the organic EL display device 50a. FIG. 3 is a cross-sectional view of the display region D of the organic EL display device 50a taken along a line III-III in FIG. 1. FIG. 4 is an equivalent circuit diagram of a TFT layer 30a included in the organic EL display device 50a. FIG. 5 is a cross-sectional view illustrating an organic EL layer 33 included in the organic EL display device 50a. FIGS. 6 and 7 are cross-sectional views of a frame region F of the organic EL display device 50a taken along a line VI-VI and line VII-VII, respectively, in FIG. 1.

As illustrated in FIG. 1, the organic EL display device 50a includes, for example, the display region D, in a rectangular shape, for displaying an image, and the frame region F provided in a periphery of the display region D.

A plurality of subpixels P are disposed in a matrix shape in the display region D, as illustrated in FIG. 2. In the display region D, for example, a subpixel P including a red light-emitting region Lr configured to execute a red display, a subpixel P including a green light-emitting region Lg configured to execute a green display, and a subpixel P including a blue light-emitting region Lb configured to execute a blue display are provided adjacent to each another, as illustrated in FIG. 2. One pixel is constituted of, for example, three adjacent subpixels P including the red light-emitting region Lr, the green light-emitting region Lg, and the blue light-emitting region Lb in the display region D.

A terminal section T is provided in a lower end portion of the frame region F, as illustrated in FIG. 1, in such a manner as to extend in one direction (a horizontal direction in FIG. 1). In the frame region F, as illustrated in FIG. 1, a slit S is formed in a second flattening film 21, which will be explained later, in a frame shape passing through the second flattening film 21 in such a manner as to surround the display region D. Further, in the frame region F, as illustrated in FIG. 1, a trench G is formed in a first flattening film 19a and the second flattening film 21, which will be explained later, between the slit S and the display region D in a substantially C shape passing through the first flattening film 19a and the second flattening film 21. As illustrated in FIG. 1, the trench G is formed in the substantially C shape being opened on the terminal section T side in a plan view.

As illustrated in FIG. 3, the organic EL display device 50a includes, in the display region D, a resin substrate layer 10 provided as a base substrate, the TFT layer 30a provided on the resin substrate layer 10, an organic EL element 35 provided, on the TFT layer 30a, as a light-emitting element included in the display region D, and a sealing film 40a provided to cover the organic EL element 35.

The resin substrate layer 10 is formed, for example, of a polyimide resin or the like.

As illustrated in FIG. 3, the TFT layer 30a includes a base coat film 11 provided on the resin substrate layer 10, a plurality of first TFTs 9a, a plurality of second TFTs 9b (see FIG. 4), a plurality of third TFTs 9e and a plurality of capacitors 9d provided on the base coat film 11, and the first flattening film 19a and the second flattening film 21 sequentially provided on each of the first TFTs 9a, each of the second TFTs 9b, each of the third TFTs 9c, and each of the capacitors 9d.

In the TFT layer 30a, as illustrated in FIG. 3, the base coat film 11, a semiconductor film, a gate insulating film 13, a first metal film, a first interlayer insulating film 15 (first inorganic insulating film), a second metal film, a second interlayer insulating film 17 (second inorganic insulating film), a third metal film, the first flattening film 19a, a fourth metal film, and the second flattening film 21 are sequentially layered on the resin substrate layer 10. The semiconductor film constitutes a semiconductor layer 12a and the like to be described later, the first metal film constitutes a gate line 14d and the like to be described later, the second metal film constitutes an upper conductive layer 16 and the like to be described later, the third metal film constitutes a source line 18f and the like to be described later, and the fourth metal film constitutes a power source line 20d and the like to be described later. The third metal film and the fourth metal film are formed by, for example, a metal layered film of a titanium film, an aluminum film and a titanium film, and have lower electrical resistance than the first metal film and the second metal film formed by, for example, a molybdenum film.

In the TFT layer 30a, as illustrated in FIGS. 2 and 4, a plurality of gate lines 14d are provided to extend parallel to each other in a horizontal direction in the figures. In the TFT layer 30a, as illustrated in FIGS. 2 and 4, a plurality of light emission control lines 14e are provided to extend parallel to each other in the horizontal direction in the figures. Each of the light emission control lines 14e is provided adjacent to each of the gate lines 14d, as illustrated in FIG. 2. In the TFT layer 30a, as illustrated in FIGS. 2 and 4, a plurality of source lines 18f are provided to extend parallel to each other in a vertical direction in the figures. In the TFT layer 30a, the power source line 20d is provided in a lattice pattern (see FIG. 1) between the first flattening film 19a and the second flattening film 21. In the TFT layer 30a, as illustrated in FIG. 4, each subpixel P includes the first TFT 9a, the second TFT 9b, the third TFT 9c, and the capacitor 9d. As illustrated in FIG. 7, in the frame region F, each source line 18f is electrically connected to a gate conductive layer 14f via a contact hole formed in a layered film of the first interlayer insulating film 15 and second interlayer insulating film 17 on an outer side of the slit S.

The base coat film 11 is formed of a single-layer film or a layered film of an inorganic insulating film of, for example, silicon nitride, silicon oxide, silicon oxynitride, or the like.

The first TFT 9a is electrically connected to the corresponding gate line 14d, source line 18f, and second TFT 9b in each subpixel P, as illustrated in FIG. 4. As illustrated in FIG. 3, the first TFT 9a includes the semiconductor layer 12a, the gate insulating film 13, a gate electrode 14a, the first interlayer insulating film 15, the second interlayer insulating film 17, and a source electrode 18a and a drain electrode 18b, which are sequentially provided on the base coat film 11. As illustrated in FIG. 3, the semiconductor layer 12a is provided in an island shape on the base coat film 11, and includes a channel region, a source region, and a drain region, as described below. As illustrated in FIG. 3, the gate insulating film 13 is so provided as to cover the semiconductor layer 12a. As illustrated in FIG. 3, the gate electrode 14a is so provided, on the gate insulating film 13, as to overlap with the channel region of the semiconductor layer 12a. As illustrated in FIG. 3, the first interlayer insulating film 15 and the second interlayer insulating film 17 are so provided in sequence as to cover the gate electrode 14a. Further, as illustrated in FIG. 3, the source electrode 18a and the drain electrode 18b are so provided, on the second interlayer insulating film 17, as to be separated from each other. The source electrode 18a and the drain electrode 18b are electrically connected to the source region and the drain region, respectively, of the semiconductor layer 12a via respective contact holes formed in a layered film including the gate insulating film 13, the first interlayer insulating film 15, and the second interlayer insulating film 17, as illustrated in FIG. 3. The gate insulating film 13, the first interlayer insulating film 15 and the second interlayer insulating film 17 are made up of a single-layer film or a layered film of an inorganic insulating film of, for example, silicon nitride, silicon oxide, silicon oxynitride, or the like.

The second TFT 9b is electrically connected to the corresponding first TFT 9a, power source line 20d, and third TFT 9C in each subpixel P, as illustrated in FIG. 4. The second TFT 9b has substantially the same structure as the first TFT 9a and the third TFT 9c.

The third TFT 9c is electrically connected to the corresponding second TFT 9b, power source line 20d, and light emission control line 14e in each subpixel P, as illustrated in FIG. 4. As illustrated in FIG. 3, the third TFT 9c includes a semiconductor layer 12b, the gate insulating film 13, a gate electrode 14b, the first interlayer insulating film 15, the second interlayer insulating film 17, and a source electrode 18c and a drain electrode 18d, which are sequentially provided on the base coat film 11. As illustrated in FIG. 3, the semiconductor layer 12b is provided in an island shape on the base coat film 11, and includes a channel region, a source region, and a drain region, similarly to the semiconductor layer 12a. As illustrated in FIG. 3, the gate insulating film 13 is so provided as to cover the semiconductor layer 12b. As illustrated in FIG. 3, the gate electrode 14b is so provided, on the gate insulating film 13, as to overlap with the channel region of the semiconductor layer 12b. As illustrated in FIG. 3, the first interlayer insulating film 15 and the second interlayer insulating film 17 are so provided in sequence as to cover the gate electrode 14b. Further, as illustrated in FIG. 3, the source electrode 18c and the drain electrode 18d are so provided, on the second interlayer insulating film 17, as to be separated from each other. The source electrode 18c and the drain electrode 18d are electrically connected to the source region and the drain region, respectively, of the semiconductor layer 12b via respective contact holes formed in a layered film including the gate insulating film 13, the first interlayer insulating film 15, and the second interlayer insulating film 17, as illustrated in FIG. 3.

In the present embodiment, the first TFT 9a, the second TFT 9b, and the third TFT 9c of a top-gate type are exemplified as the pixel TFTs, but the first TFT 9a, the second TFT 9b, and the third TFT 9c may be of a bottom-gate type.

The capacitor 9d is electrically connected to the corresponding first TFT 9a and power source line 20d in each subpixel P, as illustrated in FIG. 4. The capacitor 9d includes, as illustrated in FIG. 3, a lower conductive layer 14c formed by the same material and in the same layer as the gate electrode 14a and the like, the first interlayer insulating film 15 provided in such a manner as to cover the lower conductive layer 14c, and the upper conductive layer 16 provided on the first interlayer insulating film 15 in such a manner as to overlap with the lower conductive layer 14c. The upper conductive layer 16 is electrically connected to the power source line 20d via a contact hole (not illustrated) formed in the second interlayer insulating film 17 and the first flattening film 19a.

The first flattening film 19a has a flat surface in the display region D, and is formed, for example, of an organic resin material such as a polyimide resin. In the present embodiment, the first flattening film 19a made of polyimide resin is exemplified, but the first flattening film 19a may be formed of an organic resin material such as an acrylic resin or a polysiloxane resin.

The second flattening film 21 has a flat surface in the display region D, and is formed, for example, of an organic resin material such as a polyimide resin. In the present embodiment, the second flattening film 21 made of polyimide resin is exemplified, but the second flattening film 21 may be formed of an organic resin material such as an acrylic resin or a polysiloxane resin.

The organic EL element 35 includes, as illustrated in FIG. 3, a plurality of first electrodes 31, an edge cover 32, the plurality of organic EL layers 33, and a second electrode 34, which are provided sequentially on the TFT layer 30a.

As illustrated in FIG. 3, the plurality of first electrodes 31 are provided in a matrix shape as anode electrodes on the second flattening film 21 in such a manner as to correspond to the plurality of subpixels P. As illustrated in FIG. 3, the first electrode 31 is electrically connected to the drain electrode 18d of each third TFT 9c via a contact hole formed in the first flattening film 19a, a seventh conductive layer 20e formed by the fourth metal film, and a contact hole formed in the second flattening film 21. The first electrode 31 functions to inject holes (positive holes) into the organic EL layer 33. The first electrode 31 is preferably formed of a material having a large work function to improve the efficiency of hole injection into the organic EL layer 33. Examples of materials constituting the first electrode 31 include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn). Examples of materials constituting the first electrode 31 may include an alloy such as astatine (At)/astatine oxide ($AtO_2$). Examples of the materials constituting the first electrode 31 may further include electrically conductive oxides such as tin oxide (SnO), zinc oxide (ZnO), indium tin oxide (ITO), and indium zinc oxide (IZO). The first electrode 31 may be formed by layering a plurality of layers formed of any of the materials described above. Note that, examples of compound materials having a large work function include indium tin oxide (ITO) and indium zinc oxide (IZO).

As illustrated in FIG. 3, the edge cover 32 is provided in a lattice pattern to cover a circumferential end portion of each first electrode 31. Examples of materials constituting the edge cover 32 include organic films of, for example, polyimide resin, acrylic resin, and polysiloxane resin.

As illustrated in FIG. 3, the plurality of organic EL layers 33 are disposed on each of the first electrodes 31, and are provided in a matrix shape, as light-emitting element layers, in such a manner as to correspond to the plurality of subpixels P. As illustrated in FIG. 5, each organic EL layer 33 includes a hole injection layer 1, a hole transport layer 2, a light-emitting layer 3, an electron transport layer 4, and an electron injection layer 5, which are provided sequentially in that order over the first electrode 31.

The hole injection layer 1 is also referred to as an anode buffer layer, and functions to reduce an energy level difference between the first electrode 31 and the organic EL layer 33 to thereby improve the efficiency of hole injection into the organic EL layer 33 from the first electrode 31. Examples of materials constituting the hole injection layer 1 include triazole derivatives, oxadiazole derivatives, imidazole derivatives, polyarylalkane derivatives, pyrazoline derivatives, phenylenediamine derivatives, oxazole derivatives, styrylanthracene derivatives, fluorenone derivatives, hydrazone derivatives, and stilbene derivatives.

The hole transport layer 2 functions to improve the efficiency of hole transport from the first electrode 31 to the organic EL layer 33. Examples of materials constituting the hole transport layer 2 include porphyrin derivatives, aromatic tertiary amine compounds, styrylamine derivatives, polyvinylcarbazole, poly-p-phenylenevinylene, polysilane, triazole derivatives, oxadiazole derivatives, imidazole derivatives, polyarylalkane derivatives, pyrazoline derivatives, pyrazolone derivatives, phenylenediamine derivatives, arylamine derivatives, amine-substituted chalcone derivatives, oxazole derivatives, styrylanthracene derivatives, fluorenone derivatives, hydrazone derivatives, stilbene derivatives, hydrogenated amorphous silicon, hydrogenated amorphous silicon carbide, zinc sulfide, and zinc selenide.

The light-emitting layer 3 is a region where holes and electrons are injected from the first electrode 31 and the second electrode 34, respectively, and the holes and the electrons recombine, when a voltage is applied via the first electrode 31 and the second electrode 34. The light-emitting layer 3 is formed of a material having high light-emitting efficiency. Examples of materials constituting the light-emitting layer 3 include metal oxinoid compounds (8-hydroxyquinoline metal complexes), naphthalene derivatives, anthracene derivatives, diphenyl ethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, and polysilane.

The electron transport layer 4 functions to facilitate migration of electrons to the light-emitting layer 3 efficiently. Examples of materials constituting the electron transport layer 4 include oxadiazole derivatives, triazole derivatives, benzoquinone derivatives, naphthoquinone derivatives, anthraquinone derivatives, tetracyanoanthraquinodimethane derivatives, diphenoquinone derivatives, fluorenone derivatives, silole derivatives, and metal oxinoid compounds, as organic compounds.

The electron injection layer 5 functions to reduce an energy level difference between the second electrode 34 and the organic EL layer 33 to thereby improve the efficiency of electron injection into the organic EL layer 33 from the second electrode 34, and it is possible to lower the drive voltage of the organic EL element 35 by this function. Note that the electron injection layer 5 is also referred to as a cathode buffer layer. Examples of materials constituting the electron injection layer 5 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

The second electrode 34 is so provided on the plurality of organic EL layers 33 to be shared by the plurality of subpixels P, that is, the second electrode 34 is provided as a cathode electrode to cover each of the organic EL layers 33 and the edge cover 32, as illustrated in FIG. 3. The second electrode 34 functions to inject electrons into the organic EL layer 33. The second electrode 34 is preferably formed of a material having a small work function to improve the efficiency of electron injection into the organic EL layer 33.

Examples of materials constituting the second electrode 34 include silver (Ag), aluminum (Al), vanadium (V), calcium (Ca), titanium (Ti), yttrium (Y), sodium (Na), manganese (Mn), indium (In), magnesium (Mg), lithium (Li), ytterbium (Yb), and lithium fluoride (Lif). The second electrode 34 may be formed of alloys of magnesium (Mg)/copper (Cu), magnesium (Mg)/silver (Ag), sodium (Na)/potassium (K), astatine (At)/astatine oxide ($AtO_2$), lithium (Li)/aluminum (Al), lithium (Li)/calcium (Ca)/aluminum (Al), and lithium fluoride (LiF)/calcium (Ca)/aluminum (Al), for example. The second electrode 34 may be formed of an electrically conductive oxide such as tin oxide (SnO), zinc oxide (ZnO), indium tin oxide (ITO), and indium zinc oxide (IZO). The second electrode 34 may be formed by layering a plurality of layers of any of the materials described above. Note that, examples of materials having a small work function include magnesium (Mg), lithium (Li), lithium fluoride (LiF), magnesium (Mg)/copper (Cu), magnesium (Mg)/silver (Ag), sodium (Na)/potassium (K), lithium (Li)/aluminum (Al), lithium (Li)/calcium (Ca)/aluminum (Al), and lithium fluoride (LiF)/calcium (Ca)/aluminum (Al).

As illustrated in FIG. 3, the sealing film 40a is provided to cover the second electrode 34, includes a first inorganic film 36a, an organic film 37, and a second inorganic film 38a sequentially layered on the second electrode 34, and functions to protect the organic EL layer 33 of the organic EL element 35 from moisture, oxygen, and the like.

The first inorganic film 36a and the second inorganic film 38a are formed, for example, of an inorganic insulating film such as a silicon nitride film, a silicon oxide film, and a silicon oxynitride film.

The organic film 37 is formed, for example, of an organic resin material such as an acrylic resin, an epoxy resin, a silicone resin, a polyurea resin, a parylene resin, a polyimide resin, and a polyamide resin.

As illustrated in FIG. 6 and FIG. 7, the organic EL display device 50a includes, in the frame region F, the resin substrate layer 10; the TFT layer 30a provided on the resin substrate layer 10; a second conductive layer 31a, the second electrode 34, a first dam wall Wa, and a second dam wall Wb provided on the TFT layer 30a; and the sealing film 40a provided to cover the second electrode 34, the first dam wall Wa, and the second dam wall Wb.

As illustrated in FIG. 6, the TFT layer 30a includes a first conductive layer 20a, a third conductive layer 20b, and a fifth conductive layer 20c provided between the first flattening film 19a and the second flattening film 21, in the frame region F.

As illustrated in FIG. 6, the first conductive layer 20a is provided on the first flattening film 19a exposed from the slit S, and is formed by the fourth metal film. As illustrated in FIG. 1, the first conductive layer 20a is provided in a substantially C shape on the outer side of the trench G (on a side opposite to the display region D), both ends of the first conductive layer 20a reach the terminal section T, and a low power supply voltage (first power supply voltage) is input at the terminal section T. As illustrated in FIG. 6, a drive circuit TFT 9, which constitutes a drive circuit C such as a gate driver circuit or a light emission control circuit, is provided on the resin substrate layer 10 side of the first conductive layer 20a in such a manner as to overlap with the first conductive layer 20a. Further as illustrated in FIG. 6, the first conductive layer 20a is electrically connected to the second electrode 34 via the second conductive layer 31a, which is formed by the same material and in the same layer as the first electrode 31. The drive circuit TFT 9, which constitutes the drive circuit C, has substantially the same structure as the first TFT 9*a*, second TFT 9*b*, and third TFT 9*c*, which are provided as a pixel TFT. As illustrated in FIG. 6, the trench G includes a trench lower portion Ga formed in the first flattening film 19*a*, and a trench upper portion Gb formed in the second flattening film 21.

As illustrated in FIG. 6, the third conductive layer 20*b* is provided in the interior of the trench lower portion Ga, and is formed by the fourth metal film. As illustrated in FIG. 6, the second conductive layer 31*a* is provided to be layered on the third conductive layer 20*b* in the interior of the trench lower portion Ga and the interior of the trench upper portion Gb, and the second conductive layer 31*a* is electrically connected to the second electrode 34 in the interior of the trench G. As illustrated in FIG. 6, a fourth conductive layer 18*h* formed by the third metal film is provided on the base of the trench G.

As illustrated in FIG. 6, the fifth conductive layer 20*c* is provided on the first flattening film 19*a*, and is formed by the fourth metal film. Further, as illustrated in FIG. 1, the fifth conductive layer 20*c* is provided in a frame shape on the inner side (on the display region D side) of the trench G. As illustrated in FIGS. 1 and 7, the fifth conductive layer 20*c* is provided on the first flattening film 19*a*, which is exposed from the slit S, in a portion of the frame region F where the trench G is not formed, and is disposed on the base of the slit S. The fifth conductive layer 20*c* is configured such that both end portions of a portion of the fifth conductive layer 20*c* disposed on the base of the slit S reach the terminal section T, and a high power supply voltage (second power supply voltage) is input at the terminal section T. Each end portion of the power source line 20*d* provided in a lattice pattern in the display region D is electrically connected to the fifth conductive layer 20*c*. In other words, the power source line 20*d* branches from the fifth conductive layer 20*c* and extends to the display region D to be provided in the lattice pattern. As illustrated in FIG. 6, the drive circuit TFT 9, which constitutes the drive circuit C such as a gate driver circuit, is provided on the inner side of the trench G (the left side in the figure, the display region D side). As illustrated in FIG. 6, the drive circuit TFT 9, which constitutes the drive circuit C such as a light emission control circuit, is provided on the outer side of the trench G (the right side in the figure, the opposite side to the display region D).

As illustrated in FIGS. 6 and 7, the first dam wall Wa is provided in a frame shape on the display region D side in the interior of the slit S, and is configured to suppress spread of the organic film 37 of the sealing film 40*a*. As illustrated in FIGS. 6 and 7, the first dam wall Wa is constituted by a first resin layer 32*a* formed by the same material and in the same layer as the edge cover 32.

As illustrated in FIGS. 6 and 7, the second dam wall Wb is provided in a frame shape to surround the first dam wall Wa in an outer edge portion of the slit S, and is configured to suppress the spread of the organic film 37 of the sealing film 40*a*. As illustrated in FIGS. 6 and 7, the second dam wall Wb is constituted of the second flattening film 21, and a second resin layer 32*b* provided on the second flattening film 21 and formed by the same material and in the same layer as the edge cover 32.

As illustrated in FIG. 6 and FIG. 7, in the frame region F, the organic film 37 included in the sealing film 40*a* is provided, via the first inorganic film 36*a*, to reach the top of the first dam wall Wa. In the present embodiment, a configuration in which the organic film 37 is dammed by a side surface on the display region D side of the first dam wall Wa is described as an example, but the organic film 37 may reach the upper face of the second dam wall Wb, for example. In addition, as illustrated in FIGS. 6 and 7, a layered film of the first inorganic film 36*a* and the second inorganic film 38*a* included in the sealing film 40*a* and layered in the frame region F makes contact with the second interlayer insulating film 17 on the outer side of the second dam wall Wb, and makes contact with at least one of the inorganic insulating films included in the TFT layer 30*a*. That is, although the present embodiment exemplifies a configuration in which the layered film of the first inorganic film 36*a* and the second inorganic film 38*a* makes contact with the second interlayer insulating film 17 on the outer side of the second dam wall Wb, the layered film of the first inorganic film 36*a* and the second inorganic film 38*a* may make contact with the inorganic insulating films included in the TFT layer 30*a* on the outer side of the second dam wall Wb, in other words, may make contact with at least one of the base coat film 11, the gate insulating film 13, the first interlayer insulating film 15, and the second interlayer insulating film 17.

Figure 8:
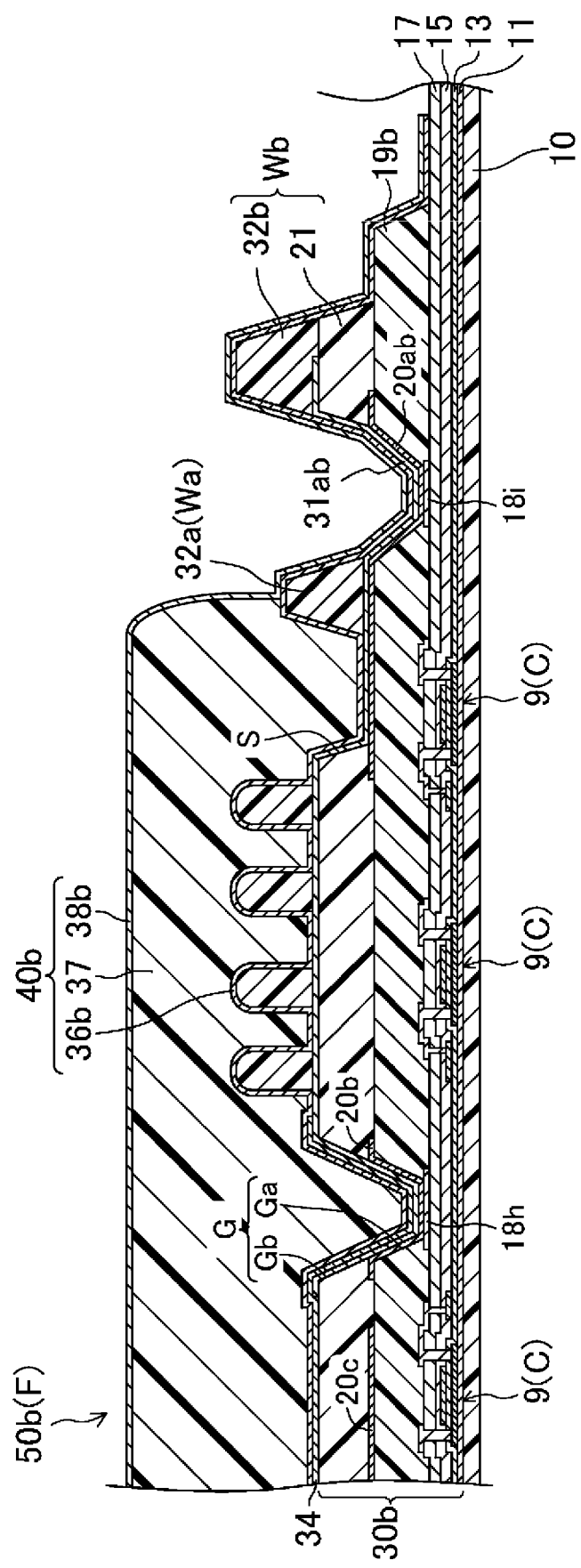
FIG. 8 is a cross-sectional view of a frame region of a modification example of the organic EL display device according to the first embodiment of the disclosure, and is a view corresponding to FIG. 6.

In the present embodiment, the organic EL display device 50*a* in which the slit S is provided in the second flattening film 21 is exemplified, but an organic EL display device 50*b* in which a slit S is extended to a first flattening film 19*b* in a lower layer relative to a second flattening film 21, as illustrated in FIG. 8, may be exemplified. FIG. 8 is a cross-sectional view of a frame region F of the organic EL display device 50*b*, which is a modification example of the organic EL display device 50*a*, and is a view corresponding to FIG. 6.

Specifically, as illustrated in FIG. 8, in a TFT layer 30*b* constituting the organic EL display device 50*b*, the slit S formed in the second flattening film 21 is extended to enter into the first flattening film 19*b* (corresponding to the first flattening film 19*a* of the organic EL display device 50*a*) between a first dam wall Wa and a second dam wall Wb. As illustrated in FIG. 8, a sixth conductive layer 18*i* formed by the third metal film is provided between the first dam wall Wa and the second dam wall Wb, and a first conductive layer 20*ab* (corresponding to the first conductive layer 20*a* of the organic EL display device 50*a*) is electrically connected to the sixth conductive layer 18*i* via the extending section of the slit S. As illustrated in FIG. 8, the first conductive layer 20*ab* is electrically connected to a second conductive layer 31*ab* (corresponding to the second conductive layer 31*a* of the organic EL display device 50*a*). As illustrated in FIG. 8, on the display region D side of the first dam wall Wa, a drive circuit TFT 9, which constitutes a drive circuit C such as a gate driver circuit or a light emission control circuit, is provided on the side of a resin substrate layer 10 of the first conductive layer 20*ab* in such a manner as to overlap with the first conductive layer 20*ab*. According to the organic EL display device 50*b*, since the first flattening film 19*b* is separated inside and outside of the slit by the slit S, it is possible to suppress the deterioration of the organic EL layer 33 and enhance the reliability of the organic EL display device 50*b*. As illustrated in FIG. 8, a sealing film 40*b* of the organic EL display device 50*b* is so provided as to cover a second electrode 34, includes a first inorganic film 36*b* (corresponding to the first inorganic film 36*a* of the organic EL display device 50*a*), an organic film 37, and a second inorganic film 38*b* (corresponding to the second inorganic film 38*a* of the organic EL display device 50*a*) sequentially layered on the second electrode 34, and functions to protect the organic EL layer 33 of the organic EL element 35 from moisture, oxygen, and the like.

In the organic EL display device 50*a* described heretofore, in each subpixel P, a gate signal is input to the first TFT 9a through the gate line 14d to thereby turn on the first TFT 9a, a predetermined voltage corresponding to a source signal is written into the gate electrode 14b of the second TFT 9b and the capacitor 9d through the source line 18f, the third TFT 9c is turned on when a light emission control signal is input to the third TFT 9c through the light emission control line 14e, and the light-emitting layer 3 of the organic EL layer 33 emits light when a current corresponding to the gate voltage of the second TFT 9b is supplied from the power source line 20d to the organic EL layer 33, whereby an image is displayed. In the organic EL display device 50a, even when the first TFT 9a is turned off, the gate voltage of the second TFT 9b is held by the capacitor 9d, and thus, the light-emitting layer 3 is kept emitting light until a gate signal of the next frame is input in each subpixel P.

A manufacturing method for the organic EL display device 50a according to the present embodiment will be described next. The manufacturing method for the organic EL display device 50a according to the present embodiment includes a TFT layer forming step, an organic EL element forming step, and a sealing film forming step.

TFT Layer Forming Step

For example, the TFT layer 30a is formed by forming, while using a known method, the base coat film 11, the first TFT 9a, the second TFT 9b, the third TFT 9c, the capacitor 9d, the drive circuit TFT 9, the first flattening film 19a, and the second flattening film 21 on the surface of the resin substrate layer 10, which is formed on a glass substrate.

In the TFT layer forming step, when forming the source line 18f and the like in the display region D, the fourth conductive layer 18h is formed in the frame region F. Then, after the formation of the first TFT 9a, the second TFT 9b, the third TFT 9c, the capacitor 9d, and the drive circuit TFT 9 by using the known method, a photosensitive polyimide resin is applied, for example, and the applied film is patterned, thereby forming the first flattening film 19a including the contact hole and the trench lower portion Ga. Subsequently, after the film formation of the fourth metal film including a titanium film, an aluminum film, and a titanium film on the first flattening film 19a, the fourth metal film is patterned to form the first conductive layer 20a, the third conductive layer 20b, the fifth conductive layer 20c, the power source line 20d, and the seventh conductive layer 20e. Furthermore, in such a manner as to cover the first conductive layer 20a, the third conductive layer 20b, the fifth conductive layer 20c, the power source line 20d, and the seventh conductive layer 20e, a photosensitive polyimide resin is applied, for example, and the applied film is patterned to form the second flattening film 21 including the contact hole, the slit S, and the trench upper portion Gb.

Organic EL Element Forming Step

The organic EL element 35 is formed by forming the first electrode 31, the edge cover 32, the organic EL layer 33 (the hole injection layer 1, the hole transport layer 2, the light-emitting layer 3, the electron transport layer 4, and the electron injection layer 5), and the second electrode 34 on the second flattening film 21 of the TFT layer 30a having been formed in the TFT layer forming step, by using a known method. In the organic EL element forming step, when forming the first electrode 31 in the display region D, the second conductive layer 31a is formed in the frame region F.

Sealing Film Forming Step

First, the first inorganic film 36a is formed by using a mask to film-form, on the substrate surface with the organic EL element 35 formed thereupon in the organic EL element forming step, an inorganic insulating film such as a silicon nitride film, a silicon oxide film, or a silicon oxynitride film to have a thickness of approximately 1000 nm by plasma CVD, for example.

Next, the organic film 37 is formed by film-forming, on the substrate surface with the first inorganic film 36a formed thereupon, an organic resin material such as an acrylic resin to have a thickness of approximately 10 μm by using an ink-jet method, for example.

Further, the second inorganic film 38a is formed by using a mask to film-form, on the substrate with the organic film 37 formed thereupon, an inorganic insulating film such as a silicon nitride film, a silicon oxide film, or a silicon oxynitride film to have a thickness of approximately 500 nm by the plasma CVD, for example, whereby the sealing film 40a is formed.

Finally, the resin substrate layer 10 is irradiated with laser light from the glass substrate side after a protective sheet (not illustrated) is bonded to the substrate surface on which the sealing film 40a is formed, as a result of which the glass substrate is peeled from a lower face of the resin substrate layer 10, and then, a protective sheet (not illustrated) is bonded to the lower face of the resin substrate layer 10, from which the glass substrate has been peeled.

The organic EL display device 50a of the present embodiment can be manufactured in this manner.

As described thus far, according to the organic EL display device 50a of the present embodiment, in the frame region F, the slit S is formed in the second flattening film 21 in a frame shape to surround the display region D, the first conductive layer 20a formed by the fourth metal film is provided on the first flattening film 19a exposed from the slit S, and the drive circuit TFT 9, which constitutes the drive circuit C, is provided on the resin substrate layer 10 side of the first conductive layer 20a, thereby making it possible to achieve the frame narrowing in the organic EL display device 50a, in which the drive circuit C is provided in a monolithic manner in the frame region F.

According to the organic EL display device 50a of the present embodiment, since the second electrode 34 is electrically connected to the first conductive layer 20a, to which the low power supply voltage (first power supply voltage) is input via the second conductive layer 31a, the electrical resistance of the second electrode 34 may be decreased, and the occurrence of uneven brightness in the display region D may be suppressed.

According to the organic EL display device 50a of the present embodiment, since the power source line 20d, to which the high power supply voltage (second power supply voltage) is input, is formed by the fourth metal film in a lattice pattern, the electrical resistance of the power source line 20d may be decreased, and the occurrence of uneven brightness in the display region D may be suppressed.

According to the organic EL display device 50a of the present embodiment, the third conductive layer 20b and the fourth conductive layer 18h are provided in the interior (and on the base) of the trench G, thereby making it possible to reliably establish the electrical connection between the second electrode 34 and the second conductive layer 31a in the trench G. This makes it possible to reliably input the low power supply voltage (first power supply voltage) to the second electrode 34a via the second conductive layer 31a.

In addition, according to the organic EL display device 50a of the present embodiment, a layered film of the first inorganic film 36a and the second inorganic film 38a included in the sealing film 40a and layered in the frame region F makes contact with the second interlayer insulating film 17 on the outer side of the second dam wall Wb.

According to this configuration, the first flattening film 19a and the second flattening film 21 made of resin material are not exposed, thereby making it possible to suppress the deterioration of the organic EL layer 33, and improve the reliability of the organic EL display device 50a.

Second Embodiment

Figure 9:
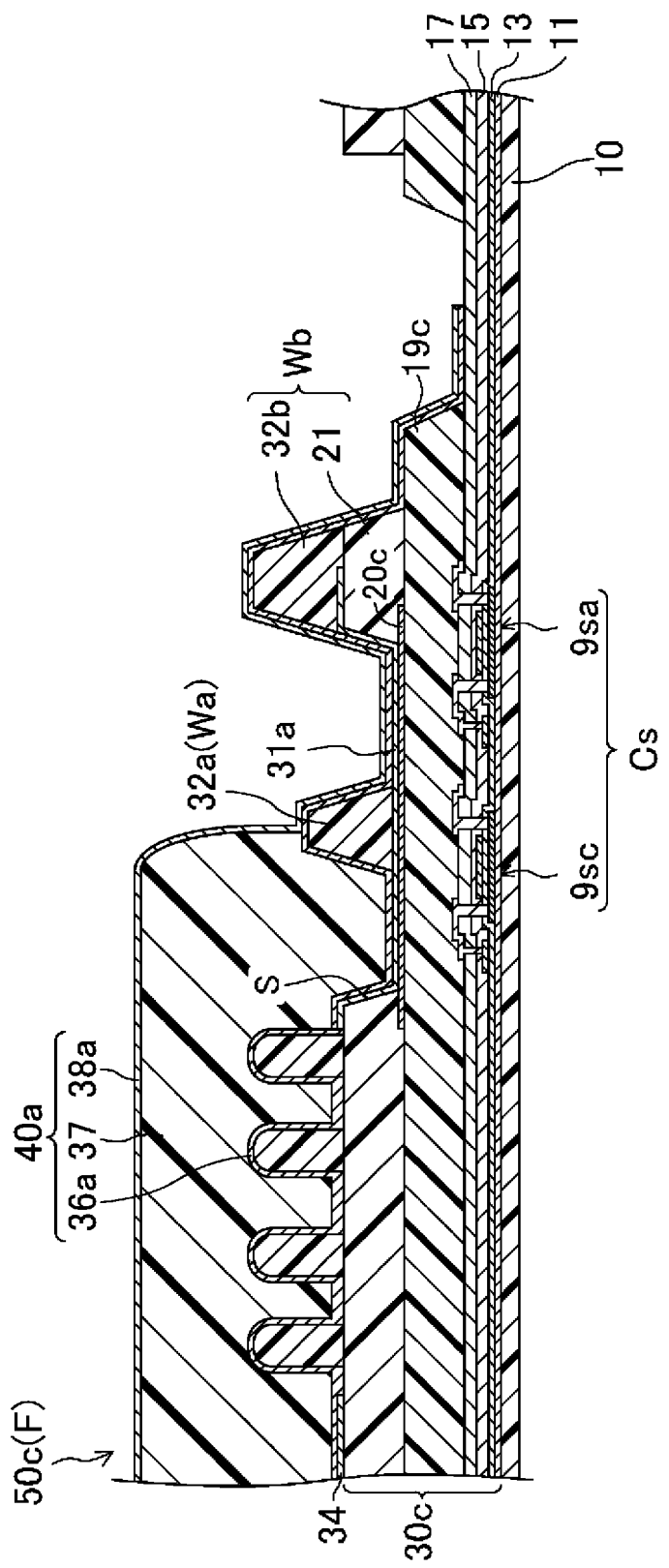
FIG. 9 is a cross-sectional view of a frame region of an organic EL display device according to a second embodiment of the disclosure, and is a view corresponding to FIG. 7.

FIGS. 9 and 10 illustrate a second embodiment of a display device according to the disclosure. FIG. 9 is a cross-sectional view of a frame region F of an organic EL display device 50c according to the present embodiment, and is a view corresponding to FIG. 7. FIG. 10 is an equivalent circuit diagram of a demultiplexer 100 provided in the frame region F of the organic EL display device 50c. Note that, in the following embodiments, portions identical to those in FIGS. 1 to 8 are denoted by the same reference signs, and their detailed descriptions are omitted.

In the first embodiment described above, the organic EL display device 50a, in which the source line 18f is disposed on the lower side of a portion of the fifth conductive layer 20c along the terminal section T, is exemplified. In the present embodiment, the organic EL display device 50c, in which first to third drive circuits TFTs 9sa to 9sc are provided on the lower side of a portion of a fifth conductive layer 20c along a terminal section T, will be exemplified.

The organic EL display device 50c, like the organic EL display device 50a of the first embodiment described above, includes a display region D and the frame region F provided on the periphery of the display region D.

As in the organic EL display device 50a of the first embodiment, the organic EL display device 50c includes, in the display region D, a resin substrate layer 10, a TFT layer 30c provided on the resin substrate layer 10, an organic EL element 35 provided on the TFT layer 30c, and a sealing film 40a provided to cover the organic EL element 35.

As illustrated in FIG. 9, the organic EL display device 50c includes, in the frame region F, the resin substrate layer 10; the TFT layer 30c provided on the resin substrate layer 10; a second conductive layer 31a, a second electrode 34, a first dam wall Wa, and a second dam wall Wb provided on the TFT layer 30c; and the sealing film 40a provided to cover the second electrode 34, the first dam wall Wa, and the second dam wall Wb.

The structure of the display region D of the TFT layer 30c is substantially the same as the structure of the display region D of the TFT layer 30a of the organic EL display device 50a of the first embodiment.

The structure of the frame region F of the TFT layer 30c is, as illustrated in FIG. 9, substantially the same as the structure of the frame region F of the TFT layer 30a of the organic EL display device 50a of the first embodiment except a point that the first to third drive circuit TFTs 9sa to 9sc included in a demultiplexer circuit Cs are provided on the resin substrate layer 10 side of the fifth conductive layer 20c in a portion of the frame region F along the terminal section T, where a trench G is not formed, in such a manner as to overlaps with the fifth conductive layer 20c. A first flattening film 19c included in the TFT layer 30c is substantially the same as the first flattening film 19a included in the TFT layer 30a of the organic EL display device 50a of the first embodiment described above. Note that in the cross-sectional view of FIG. 9, for the sake of simplicity of the drawing, the second drive circuit TFT 9sb is omitted.

The demultiplexer circuit Cs has a function of receiving one signal as an input and dividing and outputting the signal into a plurality of signals, and as illustrated in FIG. 10, the demultiplexer circuit Cs is provided as a source line drive circuit for each of data lines 101 and constitutes the demultiplexer 100. Further, as illustrated in FIG. 10, the demultiplexer circuit Cs includes the first drive circuit TFT 9sa, in which the gate electrode is electrically connected to a first switch signal line 102a; the second drive circuit TFT 9sb, in which the gate electrode is electrically connected to a second switch signal line 102b; and a third drive circuit TFT 9sc, in which the gate electrode is electrically connected to a third switch signal line 102c.

The first to third drive circuit TFTs 9sa to 9sc, similarly to the drive circuit TFT 9, have substantially the same structure as that of the first TFT 9a, second TFT 9b, and third TFT 9c provided as the pixel TFT. As illustrated in FIG. 10, in the first drive circuit TFT 9sa, the source electrode thereof is electrically connected to one of three branching lines of each data line 101 (left side in FIG. 10), and the drain electrode thereof is electrically connected to a source line 18fr for displaying red color. As illustrated in FIG. 10, in the second drive circuit TFT 9sb, the source electrode thereof is electrically connected to one of the three branching lines of each data line 101 (center side in FIG. 10), and the drain electrode thereof is electrically connected to a source line 18fg for displaying green color. Further, as illustrated in FIG. 10, in the third drive circuit TFT 9sc, the source electrode thereof is electrically connected to one of the three branching lines of each data line 101 (right side in FIG. 10), and the drain electrode thereof is electrically connected to a source line 18fb for displaying blue color.

The above-described demultiplexer circuit Cs is configured to divide and output the data signal inputted from each data line 101 to the source lines 18fr, 18fg, and 18fb by on-off control of the first to third drive circuit TFTs 9sa to 9sc in response to switching signals inputted from the first to third switch signal lines 102a to 102c. In the present embodiment, the demultiplexer circuit Cs configured to divide one signal into three signals is exemplified, but the demultiplexer circuit Cs may have a configuration in which one signal is divided into two signals.

As in the organic EL display device 50a of the first embodiment described earlier, the organic EL display device 50c has flexibility and is configured to display an image by causing the light-emitting layer 3 of the organic EL layer 33 to emit light as required via the first TFT 9a, second TFT 9b, and third TFT 9c in each subpixel P.

The organic EL display device 50c of the present embodiment can be manufactured by also forming, when forming the drive circuit TFT 9 in the manufacturing method for the organic EL display device 50a as described in the first embodiment, the first to third drive circuit TFTs 9sa to 9sc.

As described thus far, according to the organic EL display device 50c of the present embodiment, in the frame region F, a slit S is formed in a second flattening film 21 in a frame shape to surround the display region D, a first conductive layer 20a formed by a fourth metal film is provided on the first flattening film 19c exposed from the slit S, and the drive circuit TFT 9, which constitutes the drive circuit C, is provided on the resin substrate layer 10 side of the first conductive layer 20a, thereby making it possible to achieve the frame narrowing in the organic EL display device 50c, in which the drive circuit C is provided in a monolithic manner in the frame region F.

According to the organic EL display device 50c of the present embodiment, since the first to third drive circuit TFTs 9sa to 9sc included in the demultiplexer circuit Cs are provided on the resin substrate layer 10 side of the fifth conductive layer 20c in a portion of the frame region F along the terminal section T, where the trench G is not formed, in such a manner as to overlaps with the fifth conductive layer 20c, it is possible to achieve the frame narrowing in the organic EL display device 50c, in which the demultiplexer circuit Cs is provided in a monolithic manner in the frame region F.

Other Embodiments

In each of the embodiments described above, the organic EL layer having a five-layer structure including the hole injection layer, the hole transport layer, the light-emitting layer, the electron transport layer, and the electron injection layer is exemplified. It is also possible that, for example, the organic EL layer may have a three-layer structure including a hole injection-cum-transport layer, a light-emitting layer, and an electron transport-cum-injection layer.

In each of the embodiments described above, the organic EL display device including the first electrode as an anode and the second electrode as a cathode is exemplified. The disclosure is also applicable to an organic EL display device, in which the layers of the structure of the organic EL layer are in the reverse order, with the first electrode being a cathode and the second electrode being an anode.

In the above-described embodiments, the example of the organic EL display devices in which the electrode of the TFT coupled to the first electrode serves as the drain electrode is given. However, the disclosure is also applicable to an organic EL display device in which the electrode of the TFT coupled to the first electrode is referred to as the source electrode.

In each of the embodiments described above, the organic EL display device is described as a display device as an example. The disclosure is also applicable to a display device including a plurality of light-emitting elements that are driven by an electrical current. For example, the disclosure is applicable to a display device including Quantum-dot light emitting diodes (QLEDs), which are light-emitting elements using a quantum dot-containing layer.

INDUSTRIAL APPLICABILITY

As described above, the disclosure is useful for a flexible display device.

The invention claimed is:
1. A display device comprising:
a base substrate;
a TFT layer which is provided on the base substrate and in which a first metal film, a first inorganic insulating film, a second metal film, a second inorganic insulating film, a third metal film, a first flattening film, a fourth metal film, and a second flattening film are sequentially layered;
a light-emitting element included in a display region and provided on the TFT layer; and
a frame region provided on a periphery of the display region;
the light-emitting element including a plurality of first electrodes provided on the second flattening film, a plurality of light-emitting element layers provided on the plurality of first electrodes respectively, and a second electrode provided to be shared on the plurality of light-emitting element layers,
wherein in the frame region, a slit passing through the second flattening film is formed in the second flattening film to surround the display region,
a first conductive layer formed by the fourth metal film is provided on the first flattening film exposed from the slit, and
a TFT included in a drive circuit is provided on the base substrate side of the first conductive layer to overlap with the first conductive layer.
2. The display device according to claim 1, wherein the slit is formed in a frame shape.
3. The display device according to claim 1, wherein the first conductive layer is electrically connected to the second electrode via a second conductive layer formed by an identical material and in an identical layer to the material and the layer of the first electrode.
4. The display device according to claim 3, wherein the first conductive layer is configured to be input with a first power supply voltage.
5. The display device according to claim 3, wherein the drive circuit is at least one of a gate driver circuit and a light emission control circuit.
6. The display device according to claim 3, wherein a trench passing through the first flattening film and the second flattening film is formed in the first flattening film and the second flattening film in the frame region, and
a third conductive layer formed by the fourth metal film and the second conductive layer are sequentially layered in an interior of the trench, and the second conductive layer is electrically connected to the second electrode.
7. The display device according to claim 6, wherein a fourth conductive layer formed by the third metal film is provided on a base of the trench.
8. The display device according to claim 6, wherein a fifth conductive layer formed by the fourth metal film is provided in a frame shape on the display region side of the trench,
a power source line formed by the fourth metal film is provided in the display region, and
the power source line is electrically connected to the fifth conductive layer to which a second power supply voltage is input.
9. The display device according to claim 8, wherein the power source line is provided in a lattice pattern in the display region.
10. The display device according to claim 9, wherein the power source line branches from the fifth conductive layer to extend to the display region.
11. The display device according to claim 8, wherein a terminal section is provided in an end portion of the frame region in such a manner as to extend in one direction,
the fifth conductive layer is provided on the first flattening film exposed from the slit in a portion of the frame region along the terminal section, and
a TFT included in a source line drive circuit is provided on the base substrate side of the fifth conductive layer in the portion of the frame region along the terminal section in such a manner as to overlap with the fifth conductive layer.
12. The display device according to claim 11, wherein the source line drive circuit is a demultiplexer circuit.
13. The display device according to claim 1, further comprising:

a sealing film which is provided to cover the light-emitting element and in which a first inorganic film, an organic film, and a second inorganic film are layered in sequence, wherein a first dam wall configured to suppress spread of the organic film is provided in a frame shape in the interior of the slit, a second dam wall is provided in a frame shape to surround the first dam wall in an outer edge portion of the slit, and a layered film of the first inorganic film and the second inorganic film is in contact with at least one of inorganic insulating films including the first inorganic insulating film and the second inorganic insulating film that constitute the TFT layer, on an outer side of the second dam wall.

14. The display device according to claim 13, wherein the slit is extended to pass through the first flattening film between the first dam wall and the second dam wall, a sixth conductive layer formed by the third metal film is provided between the first dam wall and the second dam wall, and the first conductive layer is electrically connected to the sixth conductive layer via the extending section of the slit.

15. The display device according to claim 14, wherein the TFT is provided on the display region side of the first dam wall.

16. The display device according to claim 1, wherein the TFT includes a gate electrode formed by the first metal film, and a source electrode and a drain electrode formed by the third metal film.

17. The display device according to claim 1, wherein the third metal film and the fourth metal film have lower electrical resistance than the first metal film and the second metal film.

18. The display device according to claim 1, wherein the TFT layer includes a plurality of pixel TFTs provided in the display region, each pixel TFT including a drain electrode and a source electrode, and the first electrode is electrically connected, via a seventh conductive layer formed by the fourth metal film, to the drain or source electrode of the corresponding pixel TFT among the plurality of pixel TFTs.

19. The display device according to claim 1, wherein the light-emitting element is an organic EL element.

* * * * *